(12) United States Patent
Loehrmann et al.

(10) Patent No.: US 12,484,195 B2
(45) Date of Patent: Nov. 25, 2025

(54) ELECTRONIC COMPONENT COMPRISING A TWO-PHASE FLUID FOR EVACUATING THE HEAT ENERGY FROM THE SEMICONDUCTORS OF SAID ELECTRONIC COMPONENT

(71) Applicant: Airbus SAS, Blagnac (FR)

(72) Inventors: Antoine Loehrmann, Blagnac (FR); Olivier Crepel, Blagnac (FR)

(73) Assignee: Airbus SAS, Blagnac (FR)

( * ) Notice: Subject to any disclaimer, the term of this patent is extended or adjusted under 35 U.S.C. 154(b) by 283 days.

(21) Appl. No.: 18/460,848

(22) Filed: Sep. 5, 2023

(65) Prior Publication Data
US 2024/0090172 A1    Mar. 14, 2024

(30) Foreign Application Priority Data
Sep. 12, 2022  (FR) ...................................... 2209135

(51) Int. Cl.
*H05K 7/20*           (2006.01)

(52) U.S. Cl.
CPC ..... *H05K 7/20327* (2013.01); *H05K 7/20318* (2013.01)

(58) Field of Classification Search
CPC . H01L 23/42; H01L 23/3735; H01L 23/3736; H01L 21/56; H01L 23/295; H01L 23/3107; H01L 23/3135; H01L 23/473; H01L 23/46; H01L 23/4275; H01L 23/5383; H05K 1/0203; H05K 1/0204; H05K 1/0306; H05K 2201/0308; H05K 2201/10416; H05K 1/183; H05K 7/20927
See application file for complete search history.

(56) References Cited

U.S. PATENT DOCUMENTS

| | | | |
|---|---|---|---|
| 2013/0224510 A1* | 8/2013 | Deng | H01L 23/42 428/576 |
| 2013/0250538 A1* | 9/2013 | Le | B23K 1/0016 228/249 |
| 2018/0042139 A1* | 2/2018 | Rosales | H05K 7/20436 |
| 2019/0096780 A1 | 3/2019 | Roesner et al. | |
| 2021/0111098 A1* | 4/2021 | Joshi | H05K 7/20445 |
| 2021/0130076 A1* | 5/2021 | Brinckerhoff | A61J 7/0481 |
| 2021/0392737 A1* | 12/2021 | Altman | H05K 3/00 |

FOREIGN PATENT DOCUMENTS

DE    102016218679 A1    3/2018

OTHER PUBLICATIONS

French Search Report for corresponding French Patent Application No. 2209135 dated Apr. 28, 2023.

* cited by examiner

*Primary Examiner* — Mandeep S Buttar
(74) *Attorney, Agent, or Firm* — Greer, Burns & Crain, Ltd.

(57) ABSTRACT

An electronic component comprising a two-phase fluid for evacuating the heat energy from the semiconductors of said electronic component. The electronic component has a stack of layers of electrically conductive material and of layers of electrically non-conductive material, a volume being defined between two adjacent layers, and a semiconductor being arranged in said volume. The electronic component also has a cooling means taking the form of a two-phase fluid filling said volume.

5 Claims, 3 Drawing Sheets

ELECTRONIC COMPONENT COMPRISING A TWO-PHASE FLUID FOR EVACUATING THE HEAT ENERGY FROM THE SEMICONDUCTORS OF SAID ELECTRONIC COMPONENT

CROSS-REFERENCES TO RELATED APPLICATIONS

This application claims the benefit of French Patent Application Number 2209135 filed on Sep. 12, 2022, the entire disclosure of which is incorporated herein by way of reference.

FIELD OF THE INVENTION

The present application relates to an electronic component comprising means for directly cooling the semiconductors of said electronic component, taking the form of a two-phase fluid flowing in contact with said semiconductors.

BACKGROUND OF THE INVENTION

An electronic component according to one embodiment is presented in FIG. 1. This electronic component 10 comprises a stack of layers of copper 12a-d alternating with layers of a ceramic substrate 14a-c. The copper layers 12a, 12d are the outer layers of the stack. On one of the layers of substrate 14b, at least one semiconductor 16 is arranged. The semiconductor 16 is electrically connected to the adjacent layers of copper 12b, 12c, via solders 22. The semiconductor 16 is protected by a layer of epoxy resin 18, positioned between the layer of substrate 14b on which the semiconductor 16 is arranged and an adjacent layer of copper 12c. The electronic component 10 has a structure known by the term "direct bonded copper".

In order to cool the semiconductor 16, heat sinks 20 are attached to the electronic component 10, via a thermal paste or directly soldered to the outer layers of copper, on either side of the stack of layers. Because of the position of the heat sinks 20, the heat losses emitted by the semiconductor 16 must be evacuated through the layers of copper 12a-d and of ceramic 14a-c, this causing inefficiencies as said layers have a non-negligible thermal resistance.

Furthermore, such heat sinks have a non-negligible weight, this impacting the weight of the electronic component.

The present invention aims to propose an alternative solution to this way of cooling the semiconductors of electronic components.

SUMMARY OF THE INVENTION

To this end, one subject of the invention is an electronic component comprising a stack of at least one first and one second layer of electrically conductive material, alternating with at least one third layer of electrically non-conductive material, said third layer being positioned between said first and second layers, and comprising a first face arranged facing and at a distance from the second layer and a second face opposite the first face arranged facing and in contact with the first layer, a volume being defined between the first face of the third layer and the second layer.

According to the invention, the electronic component may comprise at least one semiconductor arranged in said volume on the first face of the third layer and cooling means taking the form of a two-phase fluid filling said volume.

Thus, the electronic component according to the invention has no layer of epoxy resin, or heat sink.

Advantageously, the electronic component according to the invention has a low weight with respect to the electronic component of the prior art, as said electronic component has no heat sinks, which have a non-negligible impact on the weight of said electronic component. Furthermore, the electronic component according to the invention has improved performance, notably by virtue of more efficient cooling of the semiconductors, this allowing their service life to be lengthened, but also better efficiency of the electronic component. Advantageously, installing the electronic component according to the invention is easier, as it is less bulky.

According to another feature, the two-phase fluid is a liquid-gas two-phase fluid. According to this feature, the volume has an inlet and an outlet, the electronic component comprises a tank of two-phase fluid, a pump fluidically connected between the tank and the inlet of said volume, the two-phase fluid flowing between the inlet and the outlet of said volume, and a condenser fluidically connected between the outlet of said volume and the inlet of the tank.

According to another feature, the liquid-gas two-phase fluid is included in the following list: a dielectric oil, purified water, methanol, acetone, R1234 refrigerant gas, and FC-7 oil.

According to another feature, the two-phase fluid is a solid-liquid two-phase fluid. According to this feature, the electronic component comprises a housing encapsulating the first, second and third layers, said housing being filled with the two-phase fluid and made of thermally conductive material.

According to another feature, the solid-liquid two-phase fluid is included in the following list: lauric acid, pure gallium, and phase change microcapsules, such as Inertek microcapsules.

According to another feature, the electronic component is a power converter, or a switch, or an inverter, or a voltage adapter, or a current adapter.

Another subject of the invention is an electronic system comprising at least one electronic component according to the invention, as well as an aircraft comprising at least one electronic system according to the invention.

BRIEF DESCRIPTION OF THE DRAWINGS

Other features and advantages will become apparent from the following description of the invention, which description is given solely by way of example, with reference to the appended drawings, in which.

DETAILED DESCRIPTION OF THE PREFERRED EMBODIMENTS

Figure 2:
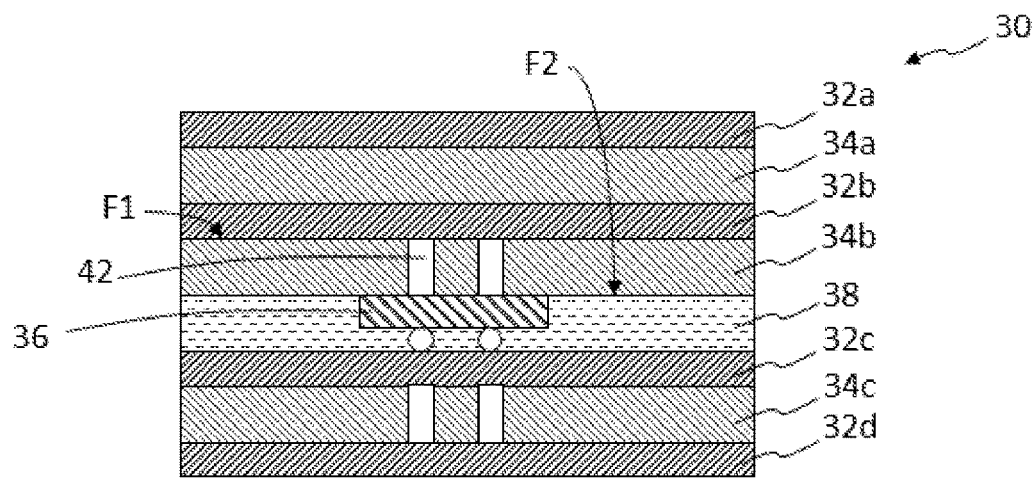
FIG. 2 is a cross-sectional schematic view of an electronic component, which illustrates one embodiment of the invention.

An electronic component 30 according to one embodiment of the invention is shown in FIG. 2. This electronic component 30 comprises a stack of layers of electrically conductive material 32a-d, such as copper, alternating with layers of electrically non-conductive material 34a-c, for example a ceramic substrate. A first and a fourth layer of copper 32a, 32d are the outer layers of the stack. The layers 34a-34c of ceramic are only inner layers of the stack. The first layer 34a of ceramic is arranged between the first and second layers of copper 32a, 32b; the second layer 34b of ceramic is arranged between the second and third layers of copper 32b, 32c; the third layer 34c of ceramic is arranged between the third and fourth layers of copper 32c, 32d. Of course, the electronic component 30 may comprise more or fewer layers 32a-d of copper or layers 34a-c of ceramic than those shown.

Between the second layer 34b of ceramic and the third layer 32c of copper, a volume 38 is defined. The second layer 34b of ceramic has a first face F1 arranged facing and in contact with the second layer 32b of copper, and an opposite second face F2 arranged facing and at a distance from the third layer 32c of copper. In other words, the layers 32a, 34a, 32b, 34b are stacked in contact on one another, in this order, without a space between said layers, and the layers 32c, 34c, 32d are stacked in contact on one another, in this order, without a space between said layers, whereas there is a space between the layers 34b and 32c.

On the layer 34b of ceramic, at the second face F2, at least one semiconductor 36 is arranged. The semiconductor 36 is thus arranged in the volume 38. The semiconductor 36 is electrically connected to the second and third layers of copper 32b, 32c, via solders 42. The electronic component 30 thus has a structure known by the term "direct bonded copper".

The volume 38 of this electronic component 30 has no epoxy resin.

Figure 1:
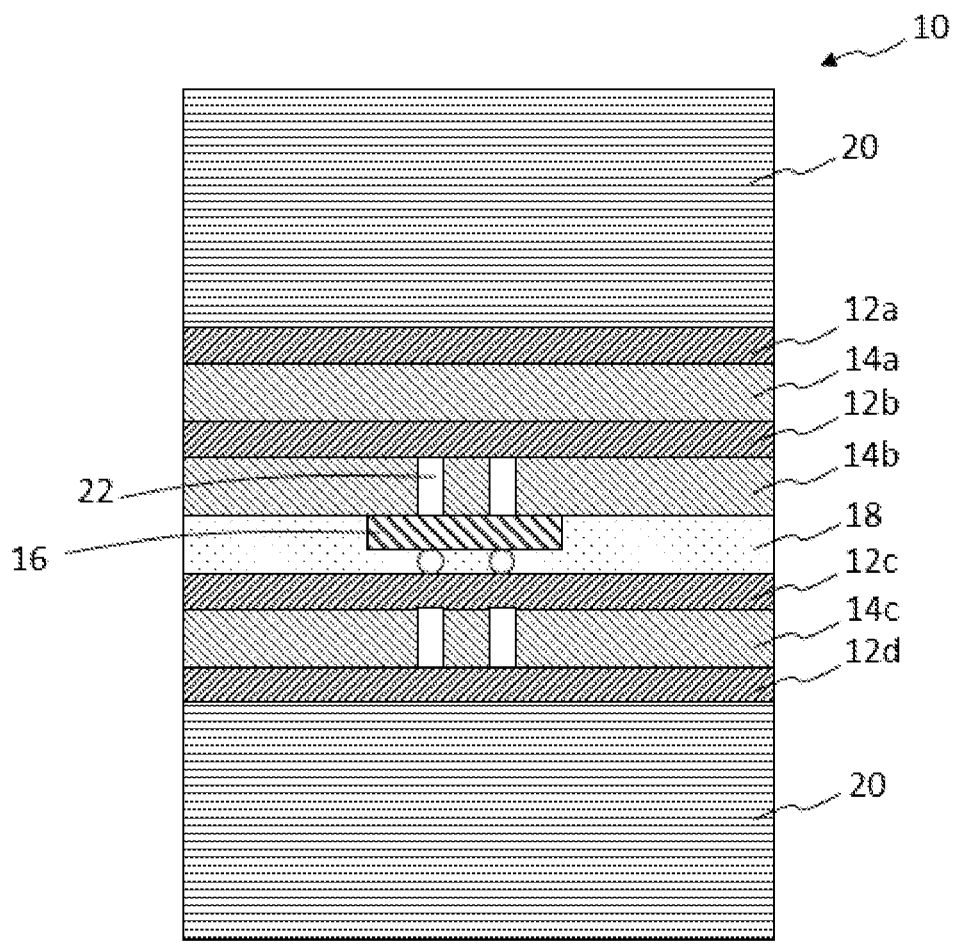
FIG. 1 is a cross-sectional schematic view of an electronic component, which illustrates one embodiment of the prior art.

The electronic component 30 comprises cooling means positioned at least in part in the volume 38. These cooling means take the form of a two-phase fluid which fills the volume 38. In other words, the semiconductor 36 is immersed in the two-phase fluid which fills the volume 38. With the exception of the surface of the semiconductor 36 which is soldered to the layer 34b of ceramic, the other surfaces of the semiconductor 36 are in contact with the two-phase fluid. The two-phase fluid is arranged in the volume 38, instead of the epoxy resin used according to the prior art shown in FIG. 1.

A two-phase fluid is a phase-change material which, depending on the temperature, can change from a phase in a first state to a phase in a second state, and vice versa. For example, the two-phase fluid may be a liquid-gas two-phase fluid, or a solid-liquid two-phase fluid.

This electronic component 30 has no heat sink.

Figure 3:
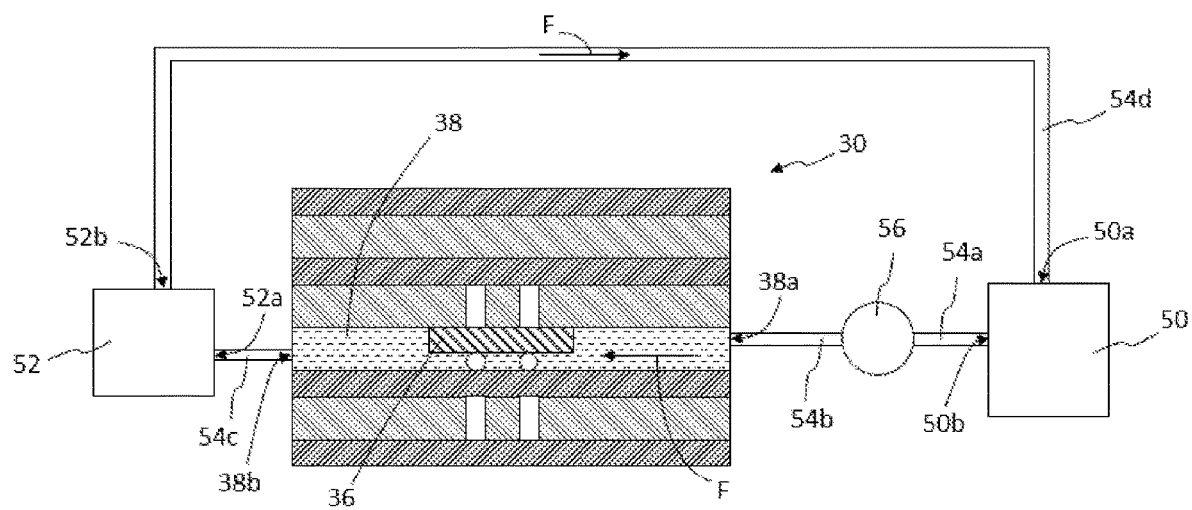
FIG. 3 is a cross-sectional schematic view of an electronic component, which illustrates a first embodiment of the invention.

According to a first embodiment shown in FIG. 3, the two-phase fluid is a liquid-gas two-phase fluid. Non-limitingly, the liquid-gas two-phase fluid may be a dielectric oil, of HFE-7000 (Hydrofluoroether) or Novec™ 7000 type, purified water, methanol, acetone, R1234 refrigerant gas, or indeed FC-7X oil. The two-phase fluid is configured to be in a liquid phase when the temperature is less than a predetermined phase-change temperature, and to move into a gas phase when the temperature becomes greater than the predetermined phase-change temperature. When the two-phase fluid is in the gas phase, this two-phase fluid is configured to move back into the liquid phase when the temperature again becomes less than the predetermined phase-change temperature.

The electronic component 30 comprises a tank 50 of two-phase fluid comprising an inlet 50a and an outlet 50b. In the tank 50, the two-phase fluid is in its liquid state. The outlet 50b of the tank 50 is fluidically connected to a pump 56, via a pipe 54a. The pump 56 is also fluidically connected to an inlet 38a of the volume 38, via a pipe 54b. The two-phase fluid flows between the inlet 38a and an outlet 38b of the volume 38. The pump 56 makes it possible to pressurize the two-phase fluid coming from the tank 50, so that the two-phase fluid is sent and flows correctly in the volume 38. The flow of the two-phase fluid is shown by the arrows F. The electronic component 30 comprises a condenser 52 fluidically connected to the outlet 38b of the volume 38 and to the inlet 50a of the tank 50, via pipes 54c, 54d, respectively.

When the electronic component 30 is in use, the temperature of the semiconductor 36 increases, and the two-phase fluid flowing between the inlet 38a and the outlet 38b of the volume 38 will move from its liquid phase to its gas phase in order to absorb this temperature rise and cool said semiconductor 36. More specifically, the phase change of the two-phase fluid makes it possible to extract the heat energy emitted by the semiconductor 36 in operation.

When the two-phase fluid in gas form moves into the condenser 52, it moves from its gas state to the liquid state, before being sent back into the tank 50. The condenser 52 thus makes it possible to cool the two-phase fluid, which has absorbed the heat energy from the semiconductor 36.

In order to cool the two-phase fluid, the condenser 52 may be in contact with the ambient air, or in contact with a secondary cooling loop.

Using cooling by means of a phase change of the two-phase fluid makes it possible, by controlling the pressure at the outlet 38b of the volume 38 of the electronic component 30, to impose the junction temperature of the semiconductor 36.

Figure 4:
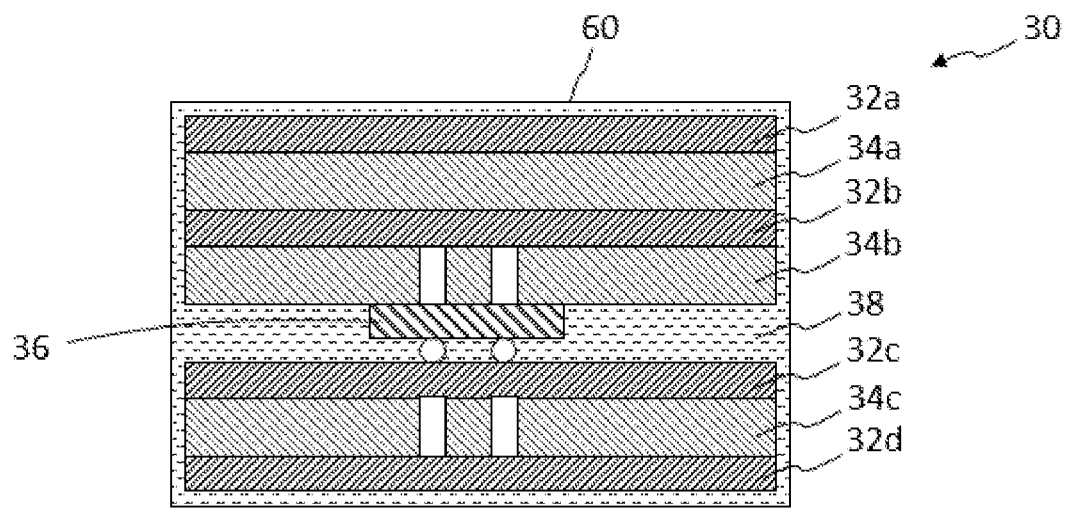
FIG. 4 is a cross-sectional schematic view of an electronic component, which illustrates a second embodiment of the invention.

According to a second embodiment shown in FIG. 4, the two-phase fluid is a solid-liquid two-phase fluid. Non-limitingly, the solid-liquid two-phase fluid may be lauric acid, such as coconut oil (phase-change temperature in the region of 25° C.), pure gallium (phase-change temperature in the region of 30° C.), or indeed Inertek microcapsules (phase-change temperature ranging from 5° C. to 28° C. depending on the microencapsulated phase-change material). The two-phase fluid is configured to be in a solid phase when the temperature is less than a predetermined phase-change temperature, and to move into a liquid phase when the temperature becomes greater than the predetermined phase-change temperature. When the two-phase fluid is in the liquid phase, this two-phase fluid is configured to move back into the solid phase when the temperature again becomes less than the predetermined phase-change temperature.

The electronic component 30 comprises a housing 60 encapsulating the layers 32a-d of copper and the layers 34a-c of ceramic. The housing 60, and notably the volume 38 between the second layer 34b of ceramic and the third layer 32c of copper, around the semiconductor 36, is filled with two-phase fluid. In the housing 60, the two-phase fluid is in its solid state. In the solid phase, the two-phase fluid performs a function of immobilizing and protecting the semiconductor 36. The housing 60 is made of thermally conductive material, for example aluminum or copper.

When the electronic component 30 is in use, the temperature of the semiconductor 36 increases, and the two-phase fluid present in the volume 38 will move from its solid phase to its liquid phase in order to extract the heat energy emitted by the semiconductor 36 in operation and to absorb this temperature rise. Next, the housing 60 is configured to thermally dissipate the energy absorbed by the two-phase fluid during the phase change. The heat energy is then evacuated by conduction into the housing 60, then by natural convection or radiation from the housing 60 into the surroundings of the electronic component 30.

Figure 5:
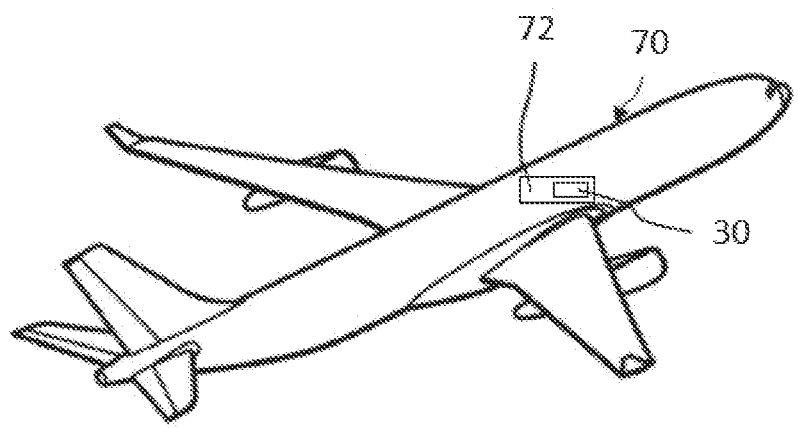
FIG. 5 is a perspective schematic view of an aircraft comprising an electronic system, itself comprising an electronic component, which illustrates one embodiment of the invention.

FIG. 5 shows an aircraft 70 into which at least one electronic system 72 comprising at least one electronic component 30 as described above is integrated.

The electronic component 30 may, non-limitingly, be a power converter, a switch, an inverter or a voltage or current adapter, and more generally any electronic component comprising at least one semiconductor referred to as a power semiconductor.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electronic component comprising: a stack of at least one first layer of electrically conductive material and one second layer of electrically conductive material, alternating with at least one third layer of electrically non-conductive material, said third layer positioned between said first and second layers, and comprising a first face arranged facing and at a distance from the second layer and a second face opposite the first face arranged facing and in contact with the first layer, a volume defined between the first face of the third layer and the second layer, at least one semiconductor arranged in said volume on the first face of the third layer, and a two-phase fluid filling said volume; wherein the two-phase fluid is a solid-liquid two-phase fluid, and wherein the electronic component comprises a housing encapsulating the first, second and third layers, said housing being filled with the two-phase fluid and made of a thermally conductive material.

2. The electronic component as claimed in claim 1, wherein the solid-liquid two-phase fluid comprises one or more of: lauric acid, pure gallium, and phase change microcapsules.

3. The electronic component as claimed in claim 1, wherein said electronic component is a power converter, or a switch, or an inverter, or a voltage adapter, or a current adapter.

4. An electronic system comprising:
the one electronic component of claim 1.

5. An aircraft comprising:
the electronic system as claimed in claim 4.

* * * * *